United States Patent
Aldefeld et al.

(10) Patent No.: US 7,417,430 B2
(45) Date of Patent: Aug. 26, 2008

(54) CONTINUOUS MOVING-TABLE MRI CONTRAST MANIPULATION AND/OR UPDATE OF SCANNING PARAMETERS

(75) Inventors: Bernd Aldefeld, Hamburg (DE); Peter Boernert, Hamburg (DE); Jochen Keupp, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 14 days.

(21) Appl. No.: 11/568,321

(22) PCT Filed: Mar. 30, 2005

(86) PCT No.: PCT/IB2005/051071

§ 371 (c)(1),
(2), (4) Date: Oct. 26, 2006

(87) PCT Pub. No.: WO2005/106522

PCT Pub. Date: Nov. 10, 2005

(65) Prior Publication Data

US 2007/0222442 A1    Sep. 27, 2007

Related U.S. Application Data

(60) Provisional application No. 60/565,881, filed on Apr. 28, 2004.

(51) Int. Cl.
*G01V 3/00* (2006.01)
(52) U.S. Cl. .................. 324/309; 324/307; 600/415
(58) Field of Classification Search ............. 600/415, 600/410; 324/306, 307, 309
See application file for complete search history.

(56) References Cited

U.S. PATENT DOCUMENTS

| 4,591,789 A | 5/1986 | Glover et al. |
| 6,385,478 B1 | 5/2002 | Hajnal |

(Continued)

FOREIGN PATENT DOCUMENTS

EP    1 398 642 A2    3/2004

OTHER PUBLICATIONS

Aldefeld, B., et al.; Sensitivity to RF and Bo Field Imperfections in Continuous Moving-Table MR Imaging; 2004; Proc. Int'l. Soc. Mag. Reson. Med.; 11; p. 102.

(Continued)

*Primary Examiner*—Louis M Arana (57) ABSTRACT

A continuous table motion magnetic resonance imaging system includes a processor (70) for determining values of scan parameters including at least a subject velocity, a field of view length in the direction of the table velocity, and a preparation sequence time. The acquisition includes performing one or more preparatory operations (54) to manipulate image contrast or to update scanning parameters during table motion. A table (16) is provided for continuously moving a supported imaging subject at the determined velocity. A magnetic resonance imaging scanner (10) through which the table continuously moves the subject acquires magnetic resonance imaging data of the imaged subject during the continuous moving using the determined scan parameters. A reconstruction processor (30, 34, 40) reconstructs the acquired data into an image of the field of view.

20 Claims, 3 Drawing Sheets

U.S. PATENT DOCUMENTS

| | | | |
|---|---|---|---|
| 6,408,201 B1 * | 6/2002 | Foo et al. | 600/410 |
| 6,671,536 B2 | 12/2003 | Mistretta | |
| 6,963,768 B2 * | 11/2005 | Ho et al. | 600/415 |
| 7,251,520 B2 * | 7/2007 | Shankaranarayanan et al. | 600/415 |
| 2002/0140423 A1 | 10/2002 | Brittain | |
| 2002/0173715 A1 | 11/2002 | Kruger et al. | |
| 2003/0011369 A1 | 1/2003 | Brittain et al. | |

OTHER PUBLICATIONS

Shankaranayanan, A., et al., Helical MR: Continuously Moving Table Axial Imaging with Radical Acquisitions; 2003; MRM; 50:1053-1060.

Zhu, Y., et al., Extended Field-of-View Imaging with Table Translation and Frequency Sweeping; 2003; MRM; 49:1106-1112.

* cited by examiner

(1) time for preparation pulses and startup cycles

CONTINUOUS MOVING-TABLE MRI CONTRAST MANIPULATION AND/OR UPDATE OF SCANNING PARAMETERS

CROSS REFERENCE TO RELATED APPLICATIONS

This application claims the benefit of U.S. provisional application Ser. No. 60/565,881 filed Apr. 28, 2004, which is incorporated herein by reference.

DESCRIPTION

The following relates to the magnetic resonance imaging arts. It finds particular application in cancer screening, angiography, and other diagnostic imaging procedures advantageously performed over the whole body or large portions thereof, and will be described with particular reference thereto. However, it also finds application in continuous moving-table magnetic resonance imaging generally.

Magnetic resonance scanners have a limited field of view that is typically substantially smaller than the average person. Thus, magnetic resonance imaging is not readily used to perform "whole body" or other extended region-of-interest imaging in which the region of interest is larger than the scanner field of view. This limits the usefulness of magnetic resonance imaging for diagnostic tasks such as cancer screening, angiography, or the like.

One approach for magnetic resonance imaging of extended region of interest larger than the scanner field of view is the multi-station method. In this approach, imaging progresses in discrete steps. During each step, one scanner field of view is imaged. Subsequently, the subject is advanced through the scanner bore by a distance equal to the length of the scanner field of view in the axial direction, and another scanner field of view is imaged. The successively imaged fields of view are sewn together to form an image of the extended region of interest.

The multi-station method has certain disadvantages. The start-and-stop motion repeated between each successive station can be disturbing to the patient. Moreover, the imaging must stop between each discrete stepwise advancement of the imaging subject through the scanner bore, which increases the total imaging session time and generates substantial discontinuities at the boundaries between successive scanner fields of view.

Another approach for imaging an extended region of interest larger than the scanner field of view is continuous moving table magnetic resonance imaging. In this approach, the patient is continuously axially advanced through the scanner bore, typically at a constant table velocity, and magnetic resonance imaging data is acquired during the continuous table advancement. This approach may be less disturbing to the patient because it eliminates the discrete start-and-stop table movements of the multi-station method. Moreover, discontinuities between successively imaged fields of view are decreased by omission of the temporally intervening discrete stepwise advancement. Discontinuities can be still further decreased in the continuous moving table approach by using a reduced field of view in the axial direction, that is, by imaging a thick slab field of view which is substantially thinner in the axial direction than the total scanner field of view. It will be appreciated that using a reduced field of view in the multi-station method is generally not advisable since it substantially increases the number of discrete advancement steps or imaged stations.

These advantages of continuous moving table imaging are, however, accompanied by significant disadvantages. The continuously moving imaging subject corresponds to an imaging subject coordinate system which is moving with reference to the magnetic fields and other aspects of the stationary magnetic resonance imaging scanner. This creates difficult timing issues in ensuring collection of a complete, but substantially non-redundant, data set. Moreover, patient-dependent tuned imaging parameters, such as coil loading, resonance frequency, patient-induced susceptibility and flip angle variations typically change during the continuous patient advancement. Still further, each voxel defined with respect to the patient (that is, defined in the imaging subject coordinate system) is continuously moving through magnetic field gradients, the $B_0$ and $B_1$ fields with their inherent inhomogeneities, and the like during the imaging. Such voxel motion can introduce accumulated phase errors or other errors in the collected k-space samples that translate into image artifacts in the reconstructed image.

Heretofore, continuous moving table imaging has been applied mainly to contrast-enhanced angiography. In this application, the progression of an injected magnetic contrast-enhancing bolus is followed through the circulatory system. Continuous table motion facilitates tracking the dynamic bolus advancement. In one particular approach, the contrast agent reduces the T1 value of blood to increase the blood/tissue contrast. Because the contrast is provided principally by the contrast agent, imaging artifacts due to the continuous patient advancement are largely suppressed.

There remains an unfulfilled need in the art for improved apparatuses and methods enabling continuous moving table magnetic resonance imaging to be more generally applied in areas such as non-contrast-enhanced imaging, phase-sensitive imaging, and the like. The present invention contemplates improved apparatuses and methods that overcome the aforementioned limitations and others.

According to one aspect, a continuous motion magnetic resonance imaging method is provided in which an imaged subject moves continuously during data acquisition. Values are determined of scan parameters including at least a velocity, a field of view length in a direction of subject movement, and a preparation sequence time. The imaged subject is continuously moved at the determined velocity. During the continuous moving, magnetic resonance imaging data of the imaged subject are acquired using the determined scan parameters. The acquiring includes performing one or more preparatory operations during one or more time intervals. The acquired data are reconstructed into an image of the field of view. The acquiring and reconstructing are continued during the continuous moving to generate an elongated image spanning a plurality of fields of view.

According to another aspect, a continuous motion magnetic resonance imaging system is disclosed. A processor is provided for determining values of scan parameters including at least a subject velocity, a field of view length in the direction of the table velocity, and a preparation sequence time. A table is provided for continuously moving a supported imaging subject at the determined velocity. A magnetic resonance imaging scanner through which the table continuously moves the subject acquires magnetic resonance imaging data of the imaged subject during the continuous moving using the determined scan parameters. The acquiring includes performing one or more preparatory operations during one or more time intervals. A reconstruction processor reconstructs the acquired data into an image of the field of view.

One advantage resides in facilitating the use of continuous moving table magnetic resonance imaging for non-contrastenhanced imaging, phase-sensitive imaging, and other types of magnetic resonance imaging.

Another advantage resides in reduced image artifacts due to accumulated phase errors, magnetic field inhomogeneity, and radio frequency field non-uniformity.

Another advantage is that seamless whole body and large area images are generated.

Yet another advantage resides in reduced total imaging session time.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

Figure 1:
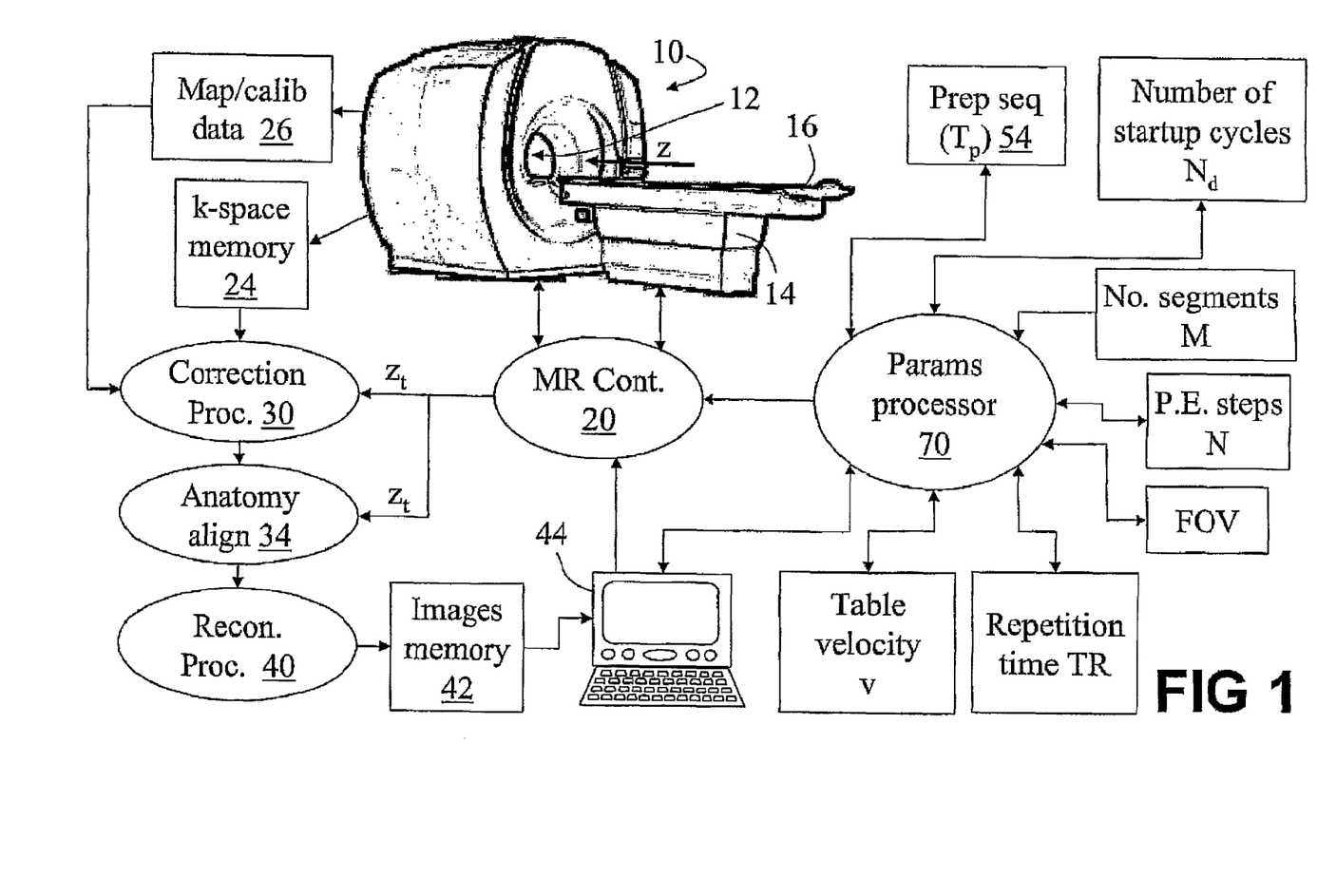
FIG. 1 diagrammatically shows an example continuous moving table magnetic resonance imaging system.

With reference to FIG. 1, a magnetic resonance imaging scanner 10 performs magnetic resonance imaging in an examination region 12. The magnetic resonance imaging scanner typically includes main magnetic field coils that produce a substantially temporally and spatially constant Bo magnetic field in the examination region 12, magnetic field gradient coils for selectively producing magnetic field gradients in the examination region 12, and one or more radio frequency coils for selectively exciting magnetic resonances in an imaging subject disposed in the examination region 12. A continuous linear translation mechanism 14 moves a pallet or other subject support 16 supporting an associated imaging subject (not shown) in a linear direction, designated the z-direction in FIG. 1, through the examination region 12. In many diagnostic imaging applications, the associated imaging subject is a patient lying prone on the table 16, and the z-direction of continuous motion corresponds to the axial direction of the patient. However, other imaging subjects and orientations of imaging subjects can be employed.

During imaging, the scanner 10 produces a substantially spatially and temporally constant $B_0$ magnetic field parallel to the z-direction. Although every effort is made to make the $B_0$ field spatially and temporally constant, there are inhomogeneities in the $B_0$ field through which the subject passes as the subject moves through the examination region 12. A magnetic resonance imaging controller 20 controls energizing of the magnetic field gradient coils and the radio frequency coil or coils of the scanner 10 to generate and spatially encode magnetic resonance in a portion of the imaging subject disposed in the examination region 12. This portion disposed in the examination region 12 continuously changes due to the continuous motion of the supporting table 16. By applying selected magnetic field gradients, a selected k-space trajectory is traversed within the examination region 12 during acquisition of magnetic resonance signals, such as a Cartesian trajectory, a plurality of radial trajectories, or a spiral trajectory. A radio frequency coil or coils of the scanner 10 is used for receiving magnetic resonance k-space samples that are stored in a k-space data memory 24.

The magnetic resonance imaging scanner is also used, in some embodiments, to acquire one or more spatial maps or calibrations, for example mapping $B_0$ magnetic field inhomogeneity, radio frequency excitation non-uniformity, a flip angle map, or the like, which are stored in a map/calibration data memory 26. The k-space samples in these embodiments are corrected by a correction processor 30 that corrects the acquired k-space samples for phase errors produced by the continuous motion of the imaging subject through inhomogeneity in the $B_0$ field, through non-uniformities of the applied radio frequency field, and through applied magnetic field gradients. The correction processor 30 receives mapping or calibration data from the map/calibration data memory 26 and also receives the table position as a function of time (denoted "$z_t$" in FIG. 1), and uses this information to associate each acquired k-space sample with the position of the continuously moving associated imaging subject in the inhomogenous magnetic fields, applied magnetic field gradients, and/or non-uniform radio frequency fields at the time the k-space sample was acquired.

An anatomy alignment processor 34 also receives the table position as a function of time (denoted "$z_t$" in FIG. 1) and uses this information to transform the k-space data into imaging subject coordinates of the continuously moving associated imaging subject. A reconstruction processor 40 reconstructs the transformed k-space samples into a reconstructed image that is stored in an images memory 42, for example by using a Fourier transform based reconstruction algorithm. The alignment processor 34 aligns the k-space data with the imaging subject coordinate system by a spatial shift in the z-direction performed after Fourier transform reconstruction, or by a demodulation of the k-space data.

A user interface 44 enables a radiologist, technician, or other operator to view the reconstructed images, transmit the reconstructed images over a hospital network, the Internet, or another computer network, print the images, or otherwise manipulate the reconstructed images. The user interface 44 preferably also interfaces the radiologist, technician, or other operator with the magnetic resonance imaging controller 20 to enable control of the operation of the magnetic resonance imaging scanner 10.

Figure 2:
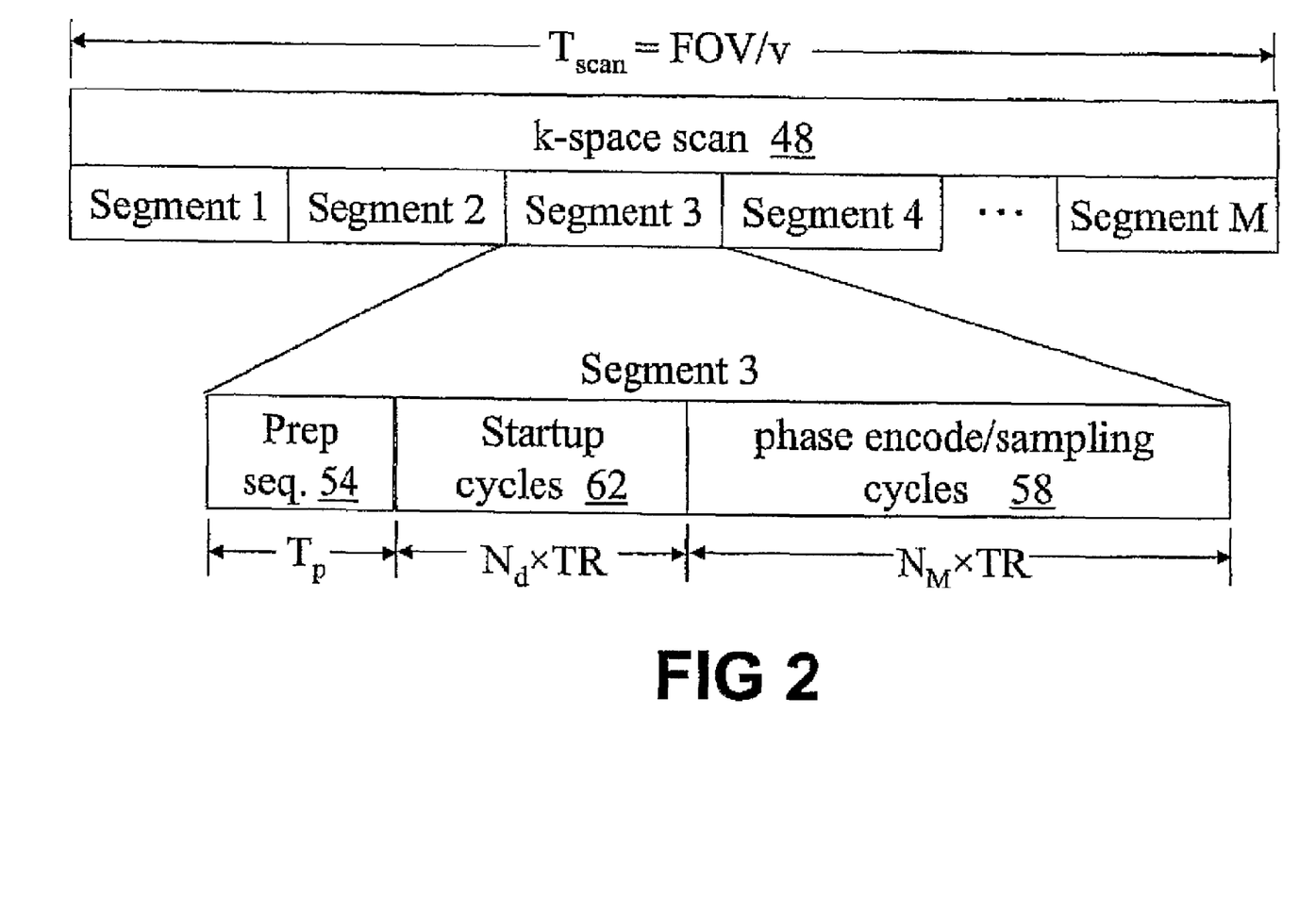
FIG. 2 diagrammatically shows an example k-space scan performed by the example continuous moving table magnetic resonance imaging system of FIG. 1.

With continuing reference to FIG. 1 and with further reference to FIG. 2, a k-space scan 48 images a field of view having a selected length (denoted FOV) in the direction of the table velocity, i.e., the z-direction. The length of the field of view in the z-direction generally corresponds to a thick slab, and is less than or equal to the length of the scanner field of view in the z-direction.

Optionally, k-space is broken up into a number of segments (the number of segments being denoted M) such as two or more segments. A single segment (M=1) can also be used (that is, the k-space may optionally not be broken up into a plurality of segments). In example FIG. 2, segments 1, 2, 3, 4, . . . M are illustrated. Each segment is acquired using a sequence including a preparatory sequence 54 which is performed over a preparatory sequence time ($T_p$), and a plurality (denoted $N_M$) of k-space phase encode/sampling cycles 58 each having a duration of a repetition time (TR). Optionally, one or more (denoted $N_d$) gradient switching startup cycles 62 each of duration TR are performed prior to acquisition of the phase encode/sampling cycles 58 to establish a steady state for the subsequent imaging. (These features are only expressly shown for segment 3 in FIG. 2.)

As labeled in FIG. 2, the preparatory sequence 54 has duration $T_p$, the startup cycles 62 have a duration $N_d \times TR$ (where $N_d$ can be equal to zero, indicating no startup cycles are employed), and the k-space phase encode/sampling cycles 58 have a duration $N_M \times TR$. Assuming no time gaps between the preparatory sequence 54, the startup cycles 62, and the k-space phase encode/sampling cycles 58, the scan time (denoted $T_{scan}$) for the k-space scan 48 is given by:

$$T_{scan} = M \times (T_p + N_d \times TR + N_M \times TR) \quad (1).$$

The total number of phase encode steps (denoted N) is given by the number of phase encode steps in each segment ($N_M$) multiplied by the number of segments (M); that is, $N = N_M \times M$. Using this expression, Equation (1) can be rewritten as:

$$T_{scan} = M \times T_p + (N + M \times N_d) \times TR \quad (2).$$

If the field of view is two-dimensional, then the total number of phase encoding steps (denoted N) corresponds to the number of lines of k-space in the two dimensional slice. On the other hand, in three-dimensional imaging, the total number of phase encoding steps is the product of the number of lines in the two phase encoding directions. That is, $N = N_1 \times N_2$ where $N_1$ and $N_2$ are the number of phase encoding lines in the two phase encoding directions, respectively. The acquisition time for non-Cartesian k-space trajectories are also readily computed by those skilled in the art.

During the course of the k-space scan 48, the table 16 is continuously moving at a fixed linear velocity (denoted v). The length of the field of view (FOV) of the imaged volume in the z-direction of the table velocity is therefore given by $v \times T_{scan}$, or equivalently, $T_{scan} = FOV/v$. Substituting this expression into Equation (2) and rearranging yields:

$$FOV = v \times [(N + M \times N_d) \times TR + M \times T_p] \quad (3).$$

It is to be appreciated that the z-direction length of the field of view of the k-space scan (denoted FOV) can be the same as the z-direction length of the scanner field of view. Alternatively, the z-direction length of the field of view of the k-space scan (denoted FOV) can be smaller than the z-direction length of the scanner field of view. Using a smaller FOV than the scanner field of view can advantageously reduce the magnitude of discontinuities in the final reconstructed image.

The startup cycles 62 are advantageous for certain types of imaging techniques, such as fast field echo (FFE) imaging, in which a steady-state should be achieved before acquiring k-space sampling image data. In other types of imaging in which achievement of a steady state or quasi-steady state condition is not advantageous, the startup cycles are suitably omitted ($N_d = 0$), in which case Equation (3) simplifies to:

$$FOV = v \times [N \times TR + M \times T_p] \quad (4).$$

In some embodiments, the preparatory operations, or some of the preparatory operations, may be suitably performed only once per field of view (i.e., once per k-space scan), as opposed to being performed for each segment of the k-space scan. For example, it may be sufficient to perform field mapping, coil loading, resonance frequency measurements, or the like once in the k-space scan, with the result used to correct data in all the segments of the field of view. Similarly, in a contrast-modification preparatory operation such as a slab saturation preparation, the contrast modification may persist long enough so that a single contrast enhancement preparation is operative for the entire k-space scan.

In the most general case, there are one or more preparatory operations performed once per field of view, and one or more other preparatory operations performed for each segment. Denoting the time per field of view for the once-per-field of view preparatory operation or operations by the time $T_{p,1}$, and the time per segment for the once-per-segment operation or operations by the time $T_{p,s}$, the average preparation time (denoted $T_p$ and used in Equations (1)-(4)) is given by:

$$T_p = (T_{p,1}/M) + T_{p,s} \quad (5).$$

If all preparatory operations are performed on a per-segment basis, $T_{p,1} = 0$ and $T_p = T_{p,s}$. On the other hand, if all preparatory operations are performed on a per-field of view basis, $T_{p,s} = 0$ and $T_p = T_{p,1}/M$.

The k-space scan 48 diagrammed in FIG. 2 places the preparatory sequence 54 in a single time interval disposed prior to the phase encode/sampling cycles 58. Certain preparatory operations, however, may be or are preferably interleaved with the phase encode steps. Some contrast-manipulating preparation pulses, for example, may have short persistence and need to be applied before each phase encode/sampling cycle, once every eight phase encode/sampling cycles, or so forth. Interleaving also advantageously reduces the discontinuity between segments that is present in the example k-space scan 48 due to the preparatory sequence 54 being grouped in a single time interval equal to $T_p$. When the preparatory sequence is partially or wholly distributed or interleaved amongst the phase encode/sampling steps, the preparation sequence time (denoted $T_p$) is computed as the sum of the time intervals over which the preparatory operations are performed.

Typically, many of the parameters of Equation (3) are fixed for a given imaging session. For example, the radiologist, technician, or other operator may select a specific FFE imaging sequence having a specific repetition time (TR), a specific number of phase encode steps (N), a specific number of segments (M), and an operator-selected length (FOV) of the field of view in the z-direction. Similarly, the preparatory sequence 54 may be a stored preparation sequence of known duration ($T_p$) selected by the operator. In this example, only the table velocity is left unspecified. Accordingly, Equation (3) is readily evaluated to determine a suitable table velocity (v) which ensures that each successive acquired field of view is adjacent to and non-overlapping with the next field of view in the imaging subject coordinates system. This value of the table velocity ensures that the continuous moving table imaging provides spatially continuous and non-redundant k-space sampling of the imaging subject over a series of successive fields of view.

Optionally, some overlap of the fields of view is chosen, for example by reducing the velocity computed using Equation (3) by a fixed percentage value. Voxel values in the overlapping region of adjacent fields of view can be averaged to reduce artifacts due to discontinuities at the boundary between fields of view.

With reference to FIG. 1, more generally a parameters processor 70 evaluates Equation (3) to determine the missing parameter value. Thus, for example, if all scan parameters except the table velocity (v) are known based on the type of scan to be performed and other information, then the parameters processor 70 computes the table velocity (v) based on Equation (3) such that the acquired field of view has the desired length (FOV) in the direction of the table velocity. Other parameters besides table velocity can be similarly computed, depending upon which values are specified by the user or by recalled stored sequences, and which values remain unknown.

Moreover, if more than one scan parameter remains unknown, Equation (3) can be evaluated to determine suitable combinations of the plurality of unknown scan parameters. The radiologist, technician, or other operator can then select from the available combinations. For example, if the table velocity and field of view are both unknown, Equation (3) can be solved for the ratio FOV/v according to:

$$FOV/v = (N + M \times N_d) \times TR + M \times T_p \qquad (6).$$

The user can then be presented with a set of proposed pairs of values for FOV and v each of which satisfy the computed FOV/v ratio. The user can then select one of the proposed pairs which provides a reasonable table velocity and field of view.

The preparatory sequence 54 may include applying a contrast-enhancing preparation sequence such as a fat saturation preparation, an outer volume pre-saturation preparation, a T2 preparation, a magnetization transfer contrast enhancement, or the like. The duration of each segment is $T_{scan}/M$; typically, the number of segments (M) is selected such that the segment duration $T_{scan}/M$ is short enough so that the generated contrast enhancement substantially endures throughout the segment duration.

Figure 3:
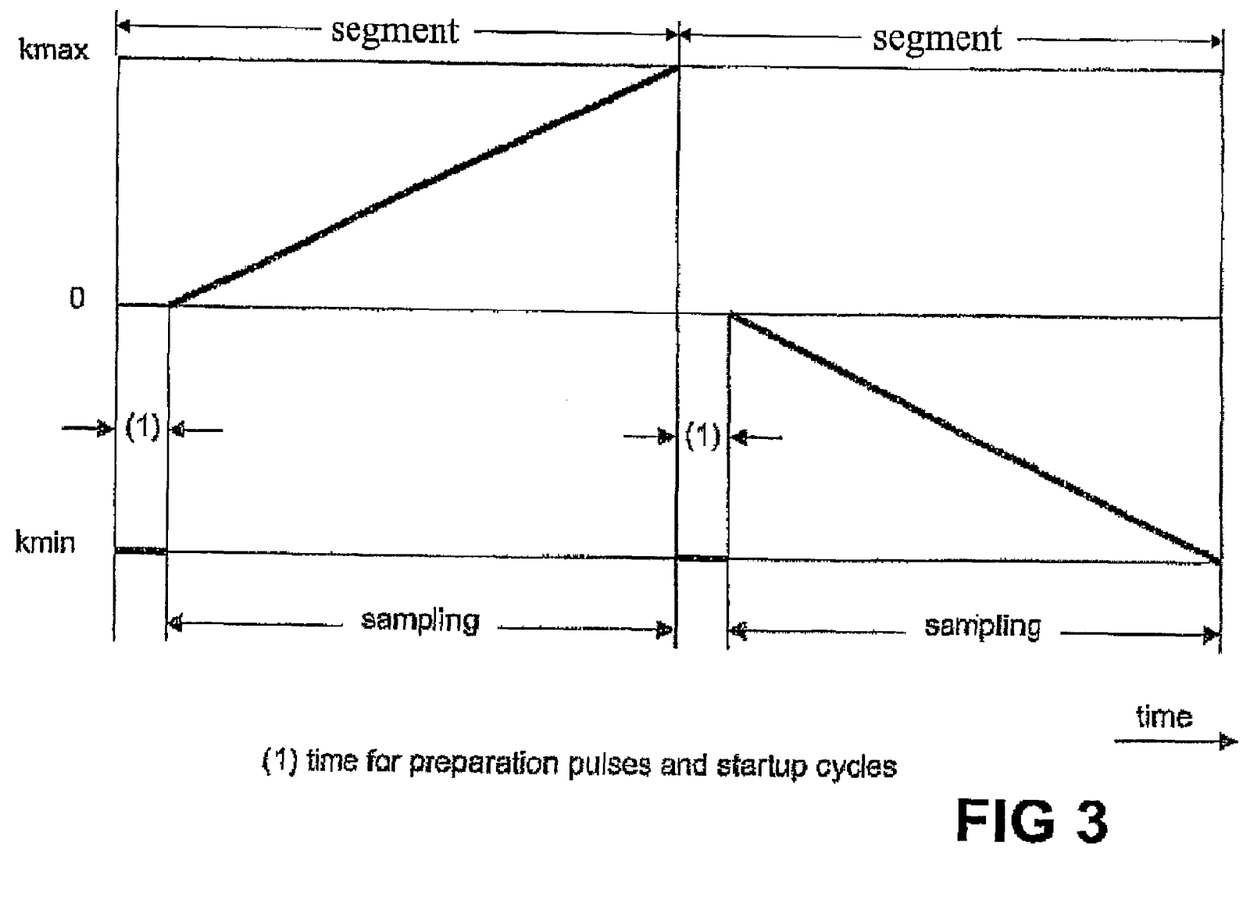
FIG. 3 diagrammatically shows a preferred k-space sampling in successive segments of a k-space scan that enhances the effectiveness of an accompanying contrast-manipulating preparatory sequence.

With reference to FIG. 3, the effect of the contrast enhancement is optionally further improved by selecting the acquisition of k-space such that the central portion of k-space is acquired first. FIG. 3 plots the values of k-space samples acquired in two successive segments. In the first segment, positive k-space values are acquired starting at k=0 and increasing until $k=k_{max}$. In the second segment, negative k-space values are acquired starting at k=0 and decreasing until $k=-k_{max}$. The preparatory sequences (denoted by "(1)" in FIG. 3) immediately precede the k-space sampling; hence the data around k=0 is acquired immediately after each preparatory sequence. In one example, the preparatory sequences (denoted "(1)" in FIG. 3) each include a T2 preparation followed by a fat suppression pulse using spectral partial inversion recovery (SPIR), followed by two startup cycles.

The preparatory sequence 54 may additionally or alternatively include other preparatory operations, such as: acquiring Bo magnetic field mapping data; acquiring flip angle mapping data; or acquiring radio frequency mapping data. Such optional mapping data update or are stored in the map/calibration data memory 26 (see FIG. 1), and if acquired are used by the correction processor 30 to correct the k-space samples for various scanner inhomogeneities or phase errors. The mapping data can also be used to adjust the scan parameters to adjust for these changes in real time. Many of these inhomogeneities are reflected in patient-dependent tuned parameters, such as: spatially varying subject-induced susceptibility ($B_0$, resonance frequency); properties of the send and/or receive radio frequency coils used in the acquisition of magnetic resonance imaging data (such as coil loading, amplitude, phase, flip angle, or so forth); anatomy dependent parameters that may influence the scanning parameters; or so forth. Since the imaging subject is continuously moving during the imaging, these patient-dependent tuned parameters or inhomogeneity maps continuously change during the imaging. Accordingly, the preparatory operations for each k-space scan 48 optionally include mapping or other determination of patient-dependent parameters.

In one example of a correction suitably performed by the correction processor 30, phase errors caused by main $B_0$ magnetic field inhomogeneities are corrected by Fourier transforming the data into the image domain (for example, by accessing the Fourier algorithm of the reconstruction processor 40) and multiplying the transformed data by a $B_0$ map acquired either before the start of the scan or during the preparatory sequence 54. Similarly, phase errors caused by non-uniformities in the radio frequency excitation can be corrected by Fourier transforming the data into the image domain and multiplying the transformed data by a radio frequency map acquired during the preparatory sequence 54. Distortions caused by non-linear magnetic field gradients can also be corrected by the correction processor 30 using techniques such as those described in Glover et al, U.S. Pat. No. 4,591,789.

The correction of acquired k-space samples can be performed for each acquired k-space line. Alternatively, if the table velocity (denoted v) is small enough, several lines of k-space can be corrected together. This latter approach recognizes that while the patient-dependent tuned parameters continuously vary as the table 16 continuously moves, those changes can be expected to be slowly varying if the table velocity is small. While correction of acquired k-space samples is advantageous for substantially any imaging sequence, it is particularly useful in phase-sensitive imaging such as FFE sequences, where accumulated phase errors can be particularly problematic.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A continuous motion magnetic resonance imaging method in which an imaged subject moves continuously during data acquisition, the method comprising:

determining values of scan parameters including at least a velocity, a field of view length in a direction of subject movement, and a preparation sequence time;

continuously moving the imaged subject at the determined velocity;

during the continuous moving, acquiring magnetic resonance imaging data of the imaged subject using the determined scan parameters, the acquiring including performing one or more preparatory operations during one or more time intervals;

correcting the acquired magnetic resonance imaging data for a spatial non-uniformity based on a non-uniformity mapping performed as one of the one or more preparatory operations;

reconstructing the acquired and corrected data into an image of the field of view; and continuing the acquiring, correcting, and reconstructing during the continuous moving to generate an elongated image spanning a plurality of fields of view.

2. The continuous motion magnetic resonance imaging method as set forth in claim 1, wherein the correcting comprises:

correcting the acquired magnetic resonance imaging data for variation of a tuned parameter due to the continuous moving.

3. The continuous motion magnetic resonance imaging method as set forth in claim 2, wherein the tuned parameter is selected from a group consisting of: (i) spatial variation of the B0 magnetic field, (ii) spatial variation of the resonance frequency, (iii) a property of a radio frequency coil used in the acquisition of magnetic resonance imaging data, and (iv) anatomy dependent parameters influencing one or more of the scan parameters.

4. The continuous motion magnetic resonance imaging method as set forth in claim 1, wherein the non-uniformity mapping includes measuring at least one of magnetic field and radio frequency inhomogeneity, and the correcting includes correcting the acquired data in accordance with the measured inhomogeneities.

5. The continuous motion magnetic resonance imaging method as set forth in claim 1, wherein the determining of values of the scan parameters comprises:
   computing a value for the velocity based on values of the other scan parameters.

6. The continuous motion magnetic resonance imaging method as set forth in claim 1, wherein the determining of values of the scan parameters comprises:
   computing a value of a selected one of the scan parameters based on values of the other scan parameters.

7. The continuous motion magnetic resonance imaging method as set forth in claim 1, wherein the one or more preparatory operations performed during the one or more time intervals include at least one of:
   applying a contrast enhancing preparation sequence,
   acquiring a B0 magnetic field map,
   acquiring a flip angle map, and
   acquiring a radio frequency map.

8. The continuous motion magnetic resonance imaging method as set forth in claim 1, wherein the one or more preparatory operations performed during the one or more time intervals include:
   applying a contrast manipulating preparation sequence, the acquiring of magnetic resonance imaging data not involving an administered contrast agent.

9. The continuous motion magnetic resonance imaging method as set forth in claim 1, wherein the reconstructing comprises:
   transforming the acquired data into subject coordinates based on position of the continuously moving imaged subject as a function of time during the acquiring; and
   reconstructing the transformed acquired data.

10. The continuous motion magnetic resonance imaging method as set forth in claim 9, wherein the determining of values of the scan parameters comprises:
    determining values of the scan parameters such that successive reconstructed images of fields of view are spatially continuous in the direction of subject movement.

11. The continuous motion magnetic resonance imaging method as set forth in claim 9, wherein the determining of values of the scan parameters comprises:
    determining values of the scan parameters such that successive reconstructed images of fields of view are spatially adjacent and non-overlapping in the direction of subject movement.

12. The continuous motion magnetic resonance imaging method as set forth in claim 9, wherein the one or more time intervals during which the one or more preparatory operations are performed sum to the determined preparation time.

13. A continuous motion magnetic resonance imaging method in which an image subject moves continuously during data acquisition, the method comprising:
    continuously moving the imaged subject at a determined velocity;
    during the continuous moving, acquiring magnetic resonance imaging data of the imaged subject;
    correcting the acquired magnetic resonance imaging data for phase error introduced by traversal of the imaged subject through an inhomogeneous magnetic field during the continuous moving;
    reconstructing the acquired and corrected data into an image of the field of view; and
    continuing the acquiring and reconstructing during the continuous moving to generate an elongated image spanning a plurality of fields of view.

14. The continuous motion magnetic resonance imaging method as set forth in claim 13, further comprising:
    performing an initial pre-scan including continuously moving the imaged subject and acquiring mapping data, the pre-scan being performed prior to the acquiring of magnetic resonance imaging data;
    computing an imaged subject position dependent calibration based on the acquired mapping data; and
    wherein the correcting of the acquired magnetic resonance imaging data for phase error based on the imaged subject position dependent calibration.

15. The continuous motion magnetic resonance imaging method as set forth in claim 13, wherein the correcting comprises:
    transforming the acquired magnetic resonance imaging data into the image domain; and
    multiplying the transformed data by a $B_0$ map.

16. The continuous motion magnetic resonance imaging method as set forth in claim 13, wherein the correcting comprises:
    transforming the acquired magnetic resonance imaging data into the image domain; and
    multiplying the transformed data by a radio frequency map.

17. A continuous motion magnetic resonance imaging system comprising:
    a processor for determining values of scan parameters including at least a subject velocity, a field of view length in the direction of the table velocity, and a preparation sequence time;
    a table for continuously moving a supported imaging subject at the determined velocity;
    a magnetic resonance imaging scanner through which the table continuously moves the subject, the scanner acquiring magnetic resonance imaging data of the imaged subject during the continuous moving using the determined scan parameters, the acquiring including performing one or more preparatory operations during one or more time intervals; and
    a reconstruction processor for reconstructing the acquired data into an image of the field of view, the reconstruction processor including a correction processor for correcting the acquired data for radio frequency excitation inhomogeneity, the reconstruction processor reconstructing the corrected acquired data.

18. A continuous motion magnetic resonance imaging system comprising:
    a processor for determining values of scan parameters including at least a subject velocity, a field of view length in the direction of the table velocity, and a preparation sequence time;
    a table for continuously moving a supported imaging subject at the determined velocity;
    a magnetic resonance imaging scanner through which the table continuously moves the subject, the scanner acquiring magnetic resonance imaging data of the imaged subject during the continuous moving using the determined scan parameters, the acquiring including performing one or more preparatory operations during one or more time intervals; and
    a reconstruction processor for reconstructing the acquired data into an image of the field of view, the reconstruction processor including a correction processor for correcting the acquired data for magnetic field inhomogeneity, the reconstruction processor reconstructing the corrected acquired data.

19. The continuous motion magnetic resonance imaging system as set forth in claim 18, wherein the reconstruction processor further comprises:
an anatomy alignment processor for transforming the acquired data into imaging subject coordinates based on position of the continuously moving table as a function of time during the acquiring.

20. The continuous motion magnetic resonance imaging system as set forth in claim 18, wherein the correction processor corrects the acquired data for motion induced accumulated phase error due to a magnetic field gradient.

* * * * *